United States Patent [19]
Phillips et al.

[11] Patent Number: 5,796,276
[45] Date of Patent: Aug. 18, 1998

[54] HIGH-SIDE-DRIVER GATE DRIVE CIRCUIT

[75] Inventors: William Phillips, Royal Oak, Mich.; Mario Paparo, S. Giovanni Della Punta, Italy

[73] Assignee: SGS-Thomson Microelectronics, Inc., Carrollton, Tex.

[21] Appl. No.: 366,781

[22] Filed: Dec. 30, 1994

[51] Int. Cl.$^6$ .................................................. H03K 3/00
[52] U.S. Cl. .................... 327/108; 327/436; 327/538; 327/545; 323/315; 323/317
[58] Field of Search .................................. 327/108, 109, 327/111, 112, 539, 309, 312, 313, 314, 541, 390, 427, 437, 538, 540, 542, 543, 545; 323/289, 315, 316, 317; 363/16, 17, 134

[56] References Cited

U.S. PATENT DOCUMENTS

| | | | |
|---|---|---|---|
| 4,381,484 | 4/1983 | Jarrett | 323/315 |
| 4,639,661 | 1/1987 | Williams et al. | 327/540 |
| 4,786,856 | 11/1988 | Metcalf et al. | 323/315 |
| 4,857,864 | 8/1989 | Tanaka et al. | 323/315 |
| 4,896,297 | 1/1990 | Miyatake et al. | 365/189.11 |
| 4,906,056 | 3/1990 | Taniguchi | 327/589 |
| 4,980,576 | 12/1990 | Rossi et al. | 327/109 |
| 5,093,585 | 3/1992 | Perkins et al. | 327/540 |
| 5,258,662 | 11/1993 | Skovmand | 327/536 |
| 5,267,201 | 11/1993 | Foss et al. | 365/189.09 |
| 5,343,141 | 8/1994 | Metro et al. | 323/316 |
| 5,352,942 | 10/1994 | Tanaka et al. | 327/538 |
| 5,365,118 | 11/1994 | Wilcox | 327/109 |
| 5,376,832 | 12/1994 | Gariboldi et al. | 327/108 |
| 5,422,587 | 6/1995 | Pulvirenti | 327/427 |
| 5,434,533 | 7/1995 | Furutani | 327/538 |

OTHER PUBLICATIONS

Wurzburg, "Ideas for Design", Electronics Design 19, Sep. 13, 1975.

Primary Examiner—Kenneth B. Wells
Attorney, Agent, or Firm—David V. Carlson; Theodore E. Galanthay; Lisa K. Jorgenson

[57] ABSTRACT

A high-side gate driving circuit, where a current-mode differential error amplifier is used to regulate the current sourced to the gate. A current path is provided from the gate to the source of the power device, and a constant current is provided to the gate. A variable current source is also provided, and this current source is controlled by the output of the error amplifier. Preferably a voltage offset (avalanche breakdown diode) is interposed between the gate and source of the high-side driver; this ensures that the feedback loop will operate in a bistable mode, which avoids instability problems.

27 Claims, 5 Drawing Sheets

HIGH-SIDE-DRIVER GATE DRIVE CIRCUIT

BACKGROUND AND SUMMARY OF THE INVENTION

The present invention relates to integrated circuits for driving half-bridge and/or H-bridge circuits, and particularly to power integrated circuits which include power transistors on-chip.

One of the most basic power circuit configurations is a bridge circuit, in which pull-up and pull-down transistors selectably pull a load node in opposite directions. A related common structure is the H-bridge circuit, in which each of two connections to a load is connected to a half-bridge circuit. (This is particularly useful for motor control, since current can be driven through the load in either of two opposite directions.) In power integrated circuits, such drivers are commonly implemented with N-channel power FETs (e.g. VDMOS devices).

In smart power chips there will often be several relevant power supply voltages (in addition to ground). Vs will be a "raw" external power supply voltage, which provides the high-current drive for the power transistors. (For example, in automotive systems this will typically be 13 V nominal, with a large variation due to poor regulation.) Vdd will be a reduced and filtered voltage (e.g. 5 V) which powers the logic elements. Vcp will be a boosted voltage, typically 15 Volts higher than the system supply Vs, i.e. about 28 V above ground in a vehicular system. However, in some cases Vcp may be as low as Vs+7 V or as high as Vs+22 V. (This boosted voltage is used to give the FETs a large gate overdrive voltage in their on-state, and thereby permits the on-state resistance of the FETs to be reduced. Moreover, when such a boosted voltage is used, the pull-up and pull-down transistors can both be NMOS, without any need for power PMOS or PNP devices.)

When one of the transistors is turned on, the gate voltage is normally supplied by a current source from Vcp (to prevent an excessively sharp turn-on transient, with resulting glitch problems).

The overdrive voltage Vcp is normally generated on-chip by a charge pump. However, this can cause a problem: suppose that one of the low side drivers on one leg is shorted to ground. The source of the high side driver on that side will therefore be pulled down; and therefore, because of the gate protection circuit, the gate of the high side driver will follow; and therefore the boosted-voltage supply line, which supplies the gate voltages, can be overloaded and pulled down well below its specified range.

If the boosted-voltage supply line is shared among multiple gate drive circuits, this can cause problems. Some chips (as in the presently preferred embodiment) include a protection circuit which monitors the charge pump voltage and disables the chip under low Vcp conditions. Without such a protection, some of the transistors may be shifted into their analog range of operation, which may increase their heat dissipation to the point where they are destroyed.

The conventional solution to this problem is simply to provide multiple separate charge pumps (one for each transistor). This requires increased area for the diode-capacitor chains (and particularly for the isolation between them). However, the present application provides a different innovative solution, which avoids the need for paralleled charge pumps.

In the present invention, a current-mode differential error amplifier is used to regulate the current sourced to the gate. A current path is provided from the gate to the source of the power device, and a constant current is provided to the gate. A variable current source is also provided, and this current source is controlled by the output of the error amplifier. Preferably a voltage offset (avalanche breakdown diode) is interposed between the gate and source of the high-side driver; this ensures that the feedback loop will operate in a bistable mode, which avoids instability problems. The maximum current is chosen, for a given target power device, to give the desired slew rate for charging the gate.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
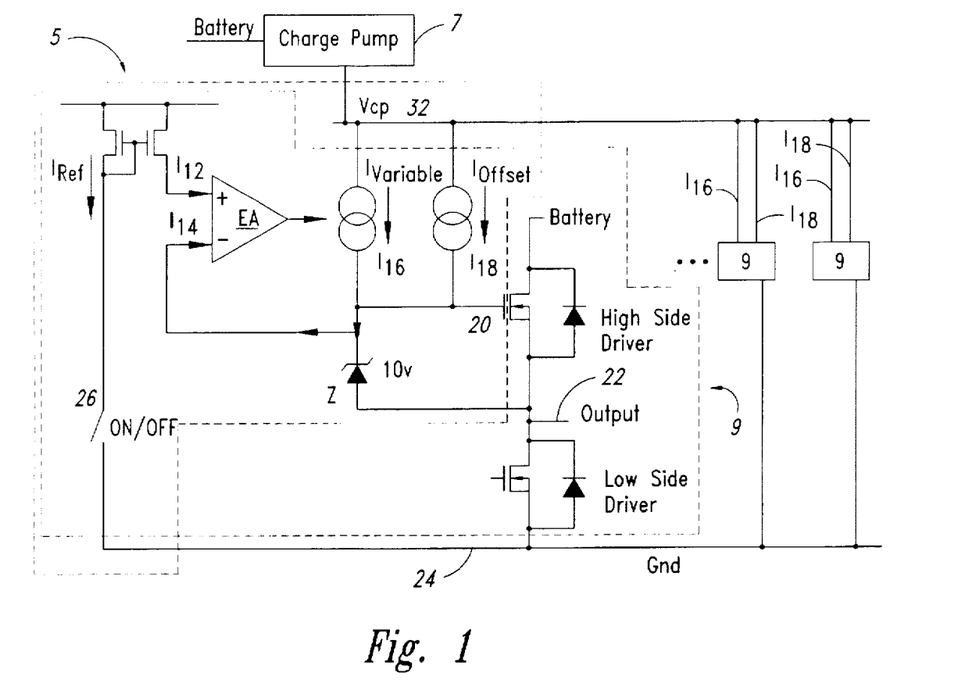
FIG. 1 is a very high-level schematic drawing which conceptually shows some principles of the invention.

The numerous innovative teachings of the present application will be described with particular reference to the presently preferred embodiment (by way of example, and not of limitation), in which:

FIG. 1 is a conceptual diagram which shows important principles of the invention. A circuit 9 represents a driver circuit, several of which can be coupled to one pumped voltage circuit. Voltage VCP is a pumped voltage 32, derived from pumping the battery voltage through charge pump 7, e.g. about 15 V above battery voltage in this example. A current source $I_{OFFSET}$, $I_{18}$, provides a constant current from Vcp to the gate 20 of the high side driver transistor. (In the presently preferred embodiment, $I_{OFFSET}$ is twice as much as $I_{REF}$.) This current will maintain diode Z at its breakdown voltage (about 10 V in this example) after the power transistor gate has been fully charged up.

Diode Z sinks current from the high side driver's gate to the output terminal 22. This current is monitored, and provides one input $I_{14}$ to the current-controlled differential error amplifier EA. The other input is provided by a current mirror $I_{12}$ of the reference current $I_{REF}$, $I_{10}$. (as long as switch ON/OFF 26 has not been activated to remove this current input from the error amplifier). The error amplifier accordingly provides a current $I_{VARIABLE}$, $I_{16}$ (also sourced from $V_{CP}$) to the gate terminal.

Thus, the basic control loop attempts to regulate $I_{VARIABLE}$ so that the negative current input to the error amplifier is equal to $I_{REF}$. When the control loop is first turned on, no gate-source current will flow, and the error amplifier will therefore turn on $I_{VARIABLE}$ to charge the gate rapidly (with about 500 μA, in the presently preferred embodiment). If the source of the high side driver is pulled down, the current through the diode Z will become large, and the current supplied to the negative input of the error amplifier will therefore be larger than $I_{REF} \cdot I_{VARIABLE}$ will therefore be off, and the boosted supply line $V_{CP}$ will be loaded only by $I_{OFFSET}$ and not by $I_{VARIABLE}$.

Figure 2A:
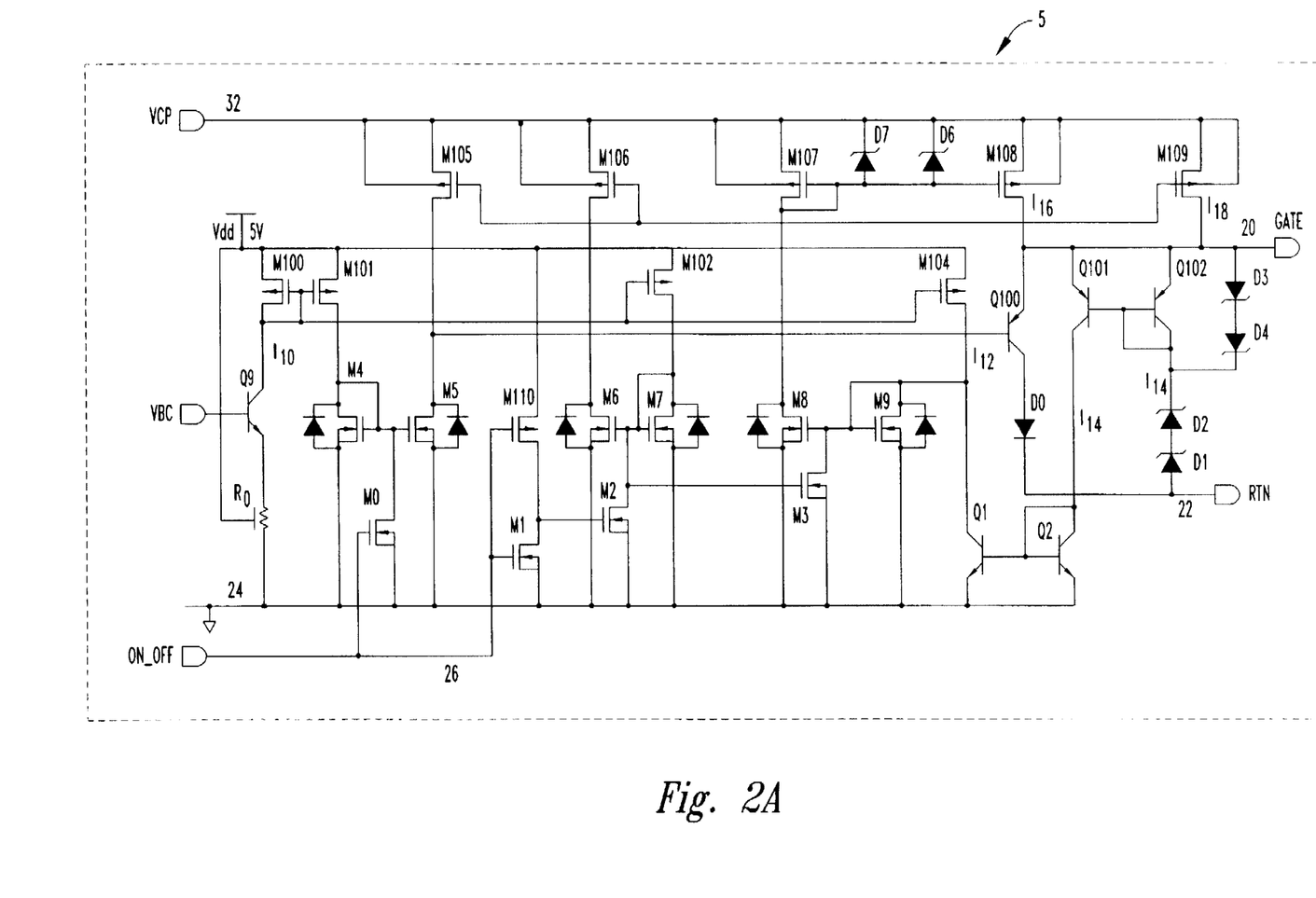
FIGS. 2a–2b is a simplified schematic view of an innovative high-side gate drive circuit as provided by the present invention.

FIG. 2A shows a sample implementation (which is currently preferred) of the innovative circuit 5, represented in FIG. 1.

Input VBG is a precision voltage from a bandgap reference, and provides a constant current through bipolar Q0 (about 20 microamps, in the presently preferred embodiment). This current is mirrored over to PMOS current source M104. The current from M104 (≠10 μA) is divided between transistor M9 and Q1. Q1 is on the receiving end of a current mirror, so M9 receives a current which is defined by a differencing relationship. The importance of this relationship will now be discussed in greater detail.

If the loop had no external constraints on it, it would try to regulate the loop such that M104 drain and Q2 collector current were almost the same (M9 carrying 1/20 of the current on the zeners, i.e. divided by the gain of the feedback path). Note that the output of PNP current mirror Q101/Q102 is mirrored (and doubled) to drive Q1; so consider what drives the input side (Q102) of the Q11/Q102 mirror: Q102 is connected, through zener (or avalanche) diodes D1 and D2, to the source (low) side of the high-side driver transistor. These two zener diodes have about 5.5 volts breakdown each, which (with a Vbe drop) defines a limit of about 12 volts maximum gate-source voltage on the output device.

Transistor M9 is a diode connected VDMOS to ground, and serves as the input to current mirror M9/M8. M8 drives the mirrored current onto PMOS M107, which is a diode-connected P-channel which is then mirrored onto M108. M108 is a very large P-channel (40 times the size of M107), which supplies approximately half a milliamp during the charging phase of the output device. That current provides the supply current for the Q101/Q102 mirror.

Thus Q102 only turns on (and the error amplifier loop only turns on) once the gate-source voltage of the power device has risen to something like 12 Volts.

One potential problem with this current differencing amplifier is that you have stability issues because it is a control loop, and there's no high impedance node to hang a stabilizing capacitor from. (However, it is preferable not to use such a capacitor anyway, because of the area consumption.) The present invention avoids this problem, since the current differencing amplifier loop only operates in two states: it is either hard-on or hard-off.

During charging of the power device, the current differencing amplifier is hard-on. It is slewed to one end of its operation, with the drain of M104 up at nearly 5 volts, and all the current from M104 going into M9 and being mirrored up to supply the maximum current to the gate to pass through the output device. In this state, Q102 is totally off.

Now suppose that the error amplifier gets to the point where it would like to regulate (i.e. M104 passing 10 microamps, the Q1 collector passing 10 microamps, Q2's collector passing 5 microamps, Q101 and Q102 passing 5 microamps each, so that a total current of 10 microamps is being supplied from Vcp by M108). M109 supplies 20 microamps, and when this target condition is reached, M109 causes the current differencing amplifier to slew from the hard-on mode of operation over the opposite (hard-off) mode of operation, and the collector of Q1 will fall to zero (i.e. Q1 will saturate).

Thus the effect of the offset contribution, caused by M109 constantly supplying 20 microamps into the gate of the output device, is to prevent the current differencing amplifier from ever staying in its analog range. Hence no stability issues appear (except transiently during turn on, and oscillation during this transient period is not really important). If the gate-source capacitance of the output device ever becomes discharged for some reason, the current differencing amplifier will immediately act to charge it back up again.

Now, consider the implication of this for the operating condition discussed in the Background section above. When the source of the high side driver is shorted to ground, the gate of the output device is pulled to 12 volts above ground 24 (by the opposed transistor Q102 and diodes D1 and D2). But with the innovative circuit of FIG. 2, because the current differencing amplifier is still slewed in its "off" state, the only current to be supplied to the circuit via M109 will be 20 microamps.

Thus, even under worst conditions, the load on Vcp is limited to 20 microamps, which means that the other gate control circuits are not disrupted.

In the presently preferred embodiment, the transient current used to charge the gate capacitance of the high side driver at turn-on is about half milliamp (500 μA), and the trickle current from the charge pump into the circuit is about 40 microamps (current drawn by the current mirror and the two zeners). The charge pump can supply about 200 microamps. In a single H-bridge, two transistors will be on at the same time; but the output capacitor of the charge pump lets it supply increased current transiently.

In the presently preferred embodiment, the transistor gate is charged up, at turn-on, in about four microseconds; but of course this can be readily changed by changing the charge pump's storage capacitor size, or by changing the power transistor's dimensions.

FIG. 2A also shows other circuitry which is used in the presently preferred embodiment. Q100 is a large PNP (18 times the minimum area), which is used for shorting out the gate to source of the output device at turn-off. (At turn-off the regulated current input to mirror M4/M5 is bypassed by M0.) The body diodes of the VDMOS power devices pass the inductive current. Switches M0, M1, and M2 just turn on current sources to turn it from one mode to the other, i.e. from on to off or vice versa.

Figure 2B:
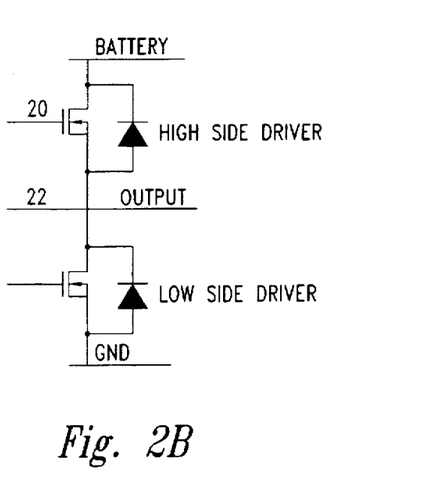

FIG. 2B shows the gate driving output 20 and circuit output 22 of FIG. 2A coupled to a driver transistor system. The high side driver is connected between the battery voltage and the output 22, while the low side driver is connected between the output and ground 24. The circuit for driving the low side driver power device is not shown, and is known in the art.

Figure 3A:
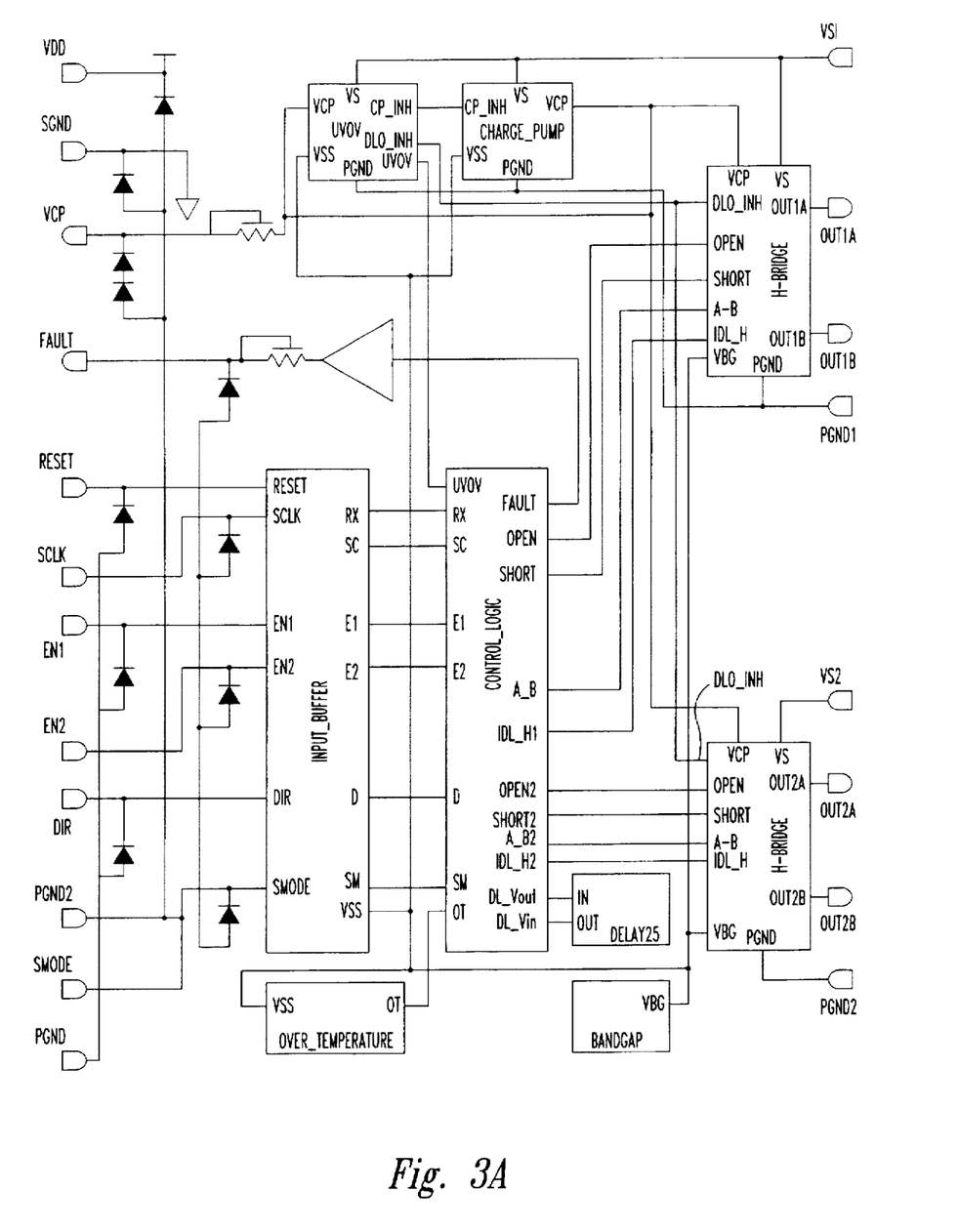
FIG. 3A is a block diagram view of a complete smart-power integrated circuit which uses the circuit of FIG. 2.

FIG. 3A is a block diagram view of a complete smart-power integrated circuit which uses the circuit of FIG. 2. This sample embodiment is a stepper motor driver circuit, which incorporates all the necessary power and logic functions to drive a two phase bipolar stepper motor in half-step or full-step mode with an output current in excess of 0.75 A. Notable features of this chip include the provision of: two h-bridge drivers; internal waveform generation; short-circuit (shorted load) and thermal protection; and open-circuit (open load) detection.

The pin function/assignments, in this sample embodiment, are as follows:

| PIN | NAME | FUNCTION |
|---|---|---|
| 1 | PGND | Power Ground (Return For VS1) |
| 2 | OUT1A | Motor Drive H-Bridge 1, Output A |
| 3 | VS1 | Switched Battery Power Supply Input 1 |
| 4 | OUT1B | Motor Drive H-Bridge 1, Output B |
| 5 | VCP | Charge Pump Capacitor |
| 6 | VDD | 5v Logic Power Supply Input |
| 7 | OUT2B | Motor Drive H-Bridge 2, Output A |
| 8 | VS2 | Switched Battery Power Supply Input 2 |
| 9 | OUT2A | Motor Drive H-Bridge 2, Output B |
| 10 | PGND | Power Ground (Return For VS2) |
| 11 | PGND | Power Ground (Return For VS2) |
| 12 | SGND | Signal Ground (Return For VDD) |
| 13 | FAULT | Over-current/Open-load/Over-temperature Fault Indicator Logic Output (Active High) |
| 14 | SMODE | Step Mode Logic Input - Full or Half Step (Logic High = Full-step, Logic Low = Half-step) |
| 15 | SCLK | Motor Control Logic Clock Input (Internal Logic Clocked on Rising Edge) |
| 16 | EN2 | H-Bridge 2 Enable Logic Input (Active High) |
| 17 | EN1 | H-Bridge 1 Enable Logic Input (Active High) |
| 18 | DIR | Motor Direction Logic Input |
| 19 | RESET | Reset Logic input (Active Low) |
| 20 | PGND | Power Ground (Return For VS1) |

The absolute maximum ratings of this device, in this sample embodiment, are as follows:

| Symbol | Parameter | Value | Unit |
|---|---|---|---|
| Vs | Switched Battery Supply Voltage | −0.3 . . . 45 | VDC |
| Vs | Switched Battery Supply Voltage Negative Transient (100 mS + 100Ω Source Impedance) | −1.5 | V |
| Vdd | Logic Power Supply | −0.3 . . . 7.0 | VDC |
| Vin | Logic Input Voltage | −0.3 . . . Vdd + 0.5 | VDC |
| Tj | Junction Temperature | −40 . . . 150 | °C. |
| Tst | Storage Temperature | −65 . . . 150 | °C. |
| Pd | Power Dissipation | Limited Internally | W |
| Iout | Maximum Output Current - Continuous - Non-Repetitive | 0.75  Limited Internally | A  A |

Figure 3B:
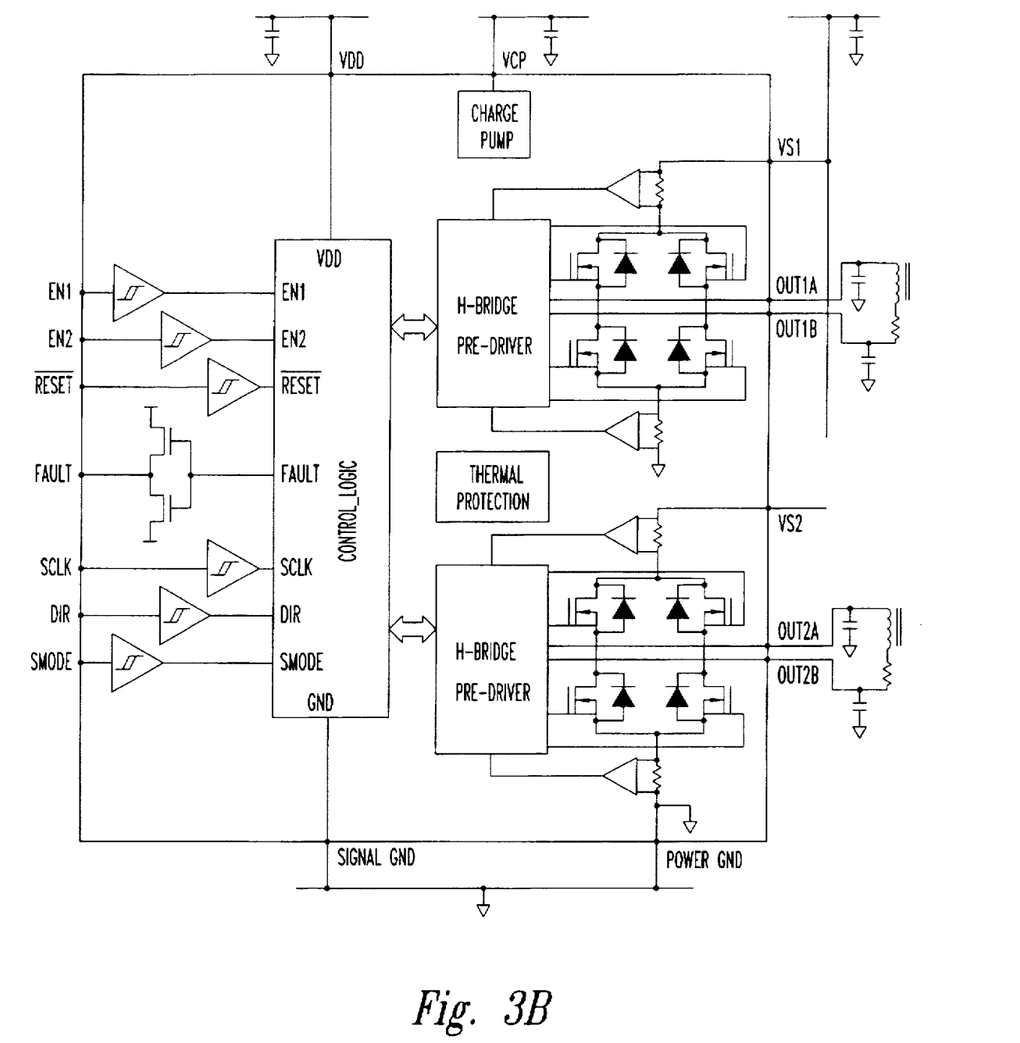
FIG. 3B is a more detailed schematic of this integrated circuit.

FIG. 3B is a more detailed schematic of the integrated circuit of FIG. 3A. Note that two H-bridge circuits H-BRIDGE are shown. These are controlled by block CONTROL_LOGIC, which also provides a fault-detection signal FAULT off-chip. Block CHARGE_PUMP provides the pumped voltage $V_{CP}$, and block UVOV, which is connected to receive the battery voltage $V_S$, pumped voltage $V_{CP}$, and power ground PGND detects undervoltage and overvoltage conditions. Block INPUT_BUFFER provides a serial interface. The OVER_TEMPERATURE, BANDGAP, and DELAY25 blocks provide the overtemperature detection, a bandgap voltage reference, and a delay line respectively.

Figure 4:
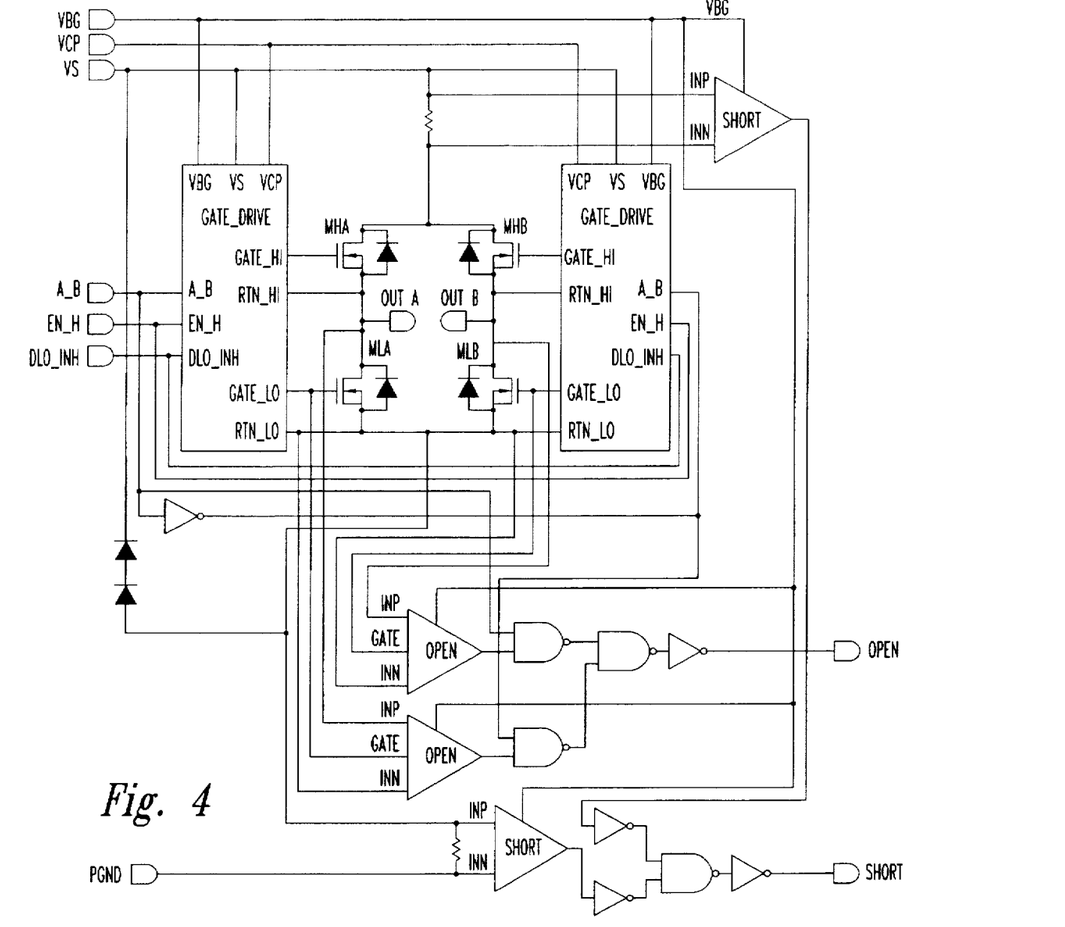
FIG. 4 is a more detailed schematic of the block H-BRIDGE in FIG. 3B.

FIG. 4 is a more detailed schematic of the block H-BRIDGE in FIG. 3B. The basic bridge circuit includes large n-channel VDMOS drivers MHA, MHB, MLA, and MLA, connected to form two half-bridge circuits MHA/MLA (driving terminal OUTA) and MHB/MLB (driving terminal OUTB). The logic at lower right detects open and short conditions.

Figure 5:
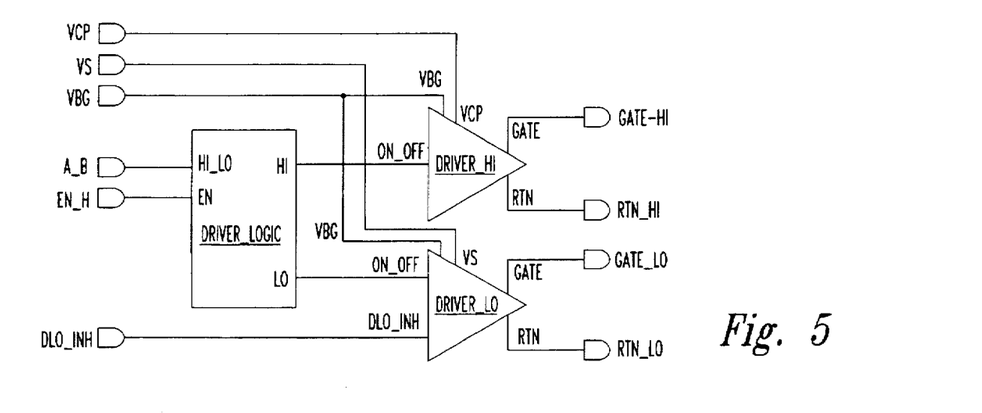
FIG. 5 shows a further detail of the GATE_DRIVE block in FIG. 4, showing how the driver logic controls both a DRIVER_HI circuit and a DRIVER_LO circuit.

FIG. 5 shows further detail of the GATE_DRIVE block in FIG. 4, showing how the driver logic DRIVER_LOGIC controls both a DRIVER_HI circuit and a DRIVER_LO circuit. (FIG. 2 is a detailed view of the DRIVER_HI circuit.)

According to a disclosed class of innovative embodiments, there is provided: A method for driving a gate drive output connection, for controlling a voltage-controlled semiconductor power switching device, comprising the steps of: (a.) operating a differential current-mode error amplifier which compares the current passed externally from a gate terminal to a first source/drain terminal of the switching device with a reference current; and (b.) providing a variable current to the gate of the power switching device, through a current source which is controlled by the output of said error amplifier; (c.) wherein said error amplifier is connected to increase said variable current when said current passed externally from gate to said first source/drain terminal of the switching device becomes less than said reference current; whereby when said error amplifier and reference current are turned on while said gate is discharged, said error amplifier increases said variable current to a maximum value.

According to another disclosed class of innovative embodiments, there is provided: A method for driving a gate drive output connection, for controlling a voltage-controlled semiconductor power switching device, comprising the steps of: (a.) operating a differential current-mode error amplifier which compares the current passed externally from a gate terminal to a first source/drain terminal of the switching device with a reference current; and (b.) providing a variable current to the gate of the power switching device, through a current source which is controlled by the output of said error amplifier; (c.) wherein said error amplifier is connected to increase said variable current when said current passed externally from gate to said first source/drain terminal of the switching device becomes less than said reference current; (d.) providing a constant offset current to the gate of the power switching device, and providing a voltage offset between the gate and source of the power switching device; whereby when said error amplifier and reference current are turned on while said gate is discharged, said error amplifier increases said variable current to a maximum value.

According to another disclosed class of innovative embodiments, there is provided: A method for driving a gate drive output connection, for controlling a voltage-controlled semiconductor power switching device, comprising the steps of: (a.) providing a reference current; (b.) diverting a portion of said reference current into at least a first circuit branch, said first circuit branch drawing an amount of current which is dependent on the voltage of the gate drive output; (c.) connecting the remaining portion of said reference current to drive a second circuit branch which is operatively connected to provide current to the gate drive output in dependence on the remaining portion of said reference current.

According to another disclosed class of innovative embodiments, there is provided: A method for driving a gate drive output connection, for controlling a voltage-controlled semiconductor power switching device, comprising the steps of: (a.) providing a reference current; (b.) diverting a portion of said reference current into at least a first circuit branch, said first circuit branch drawing an amount of current which is dependent on the voltage of the gate drive output, and which is zero unless the gate drive output exceeds a predetermined minimum voltage; (c.) connecting the remaining portion of said reference current to drive a second circuit branch which is operatively connected to provide current to the gate drive output in dependence on the remaining portion of said reference current.

According to another disclosed class of innovative embodiments, there is provided: A method for driving a gate drive output connection, for controlling a voltage-controlled semiconductor power switching device, comprising the steps of: (a.) providing a reference current; (b.) diverting a portion of said reference current into at least a first circuit branch, said first circuit branch drawing an amount of current which is dependent on the voltage of the gate drive output; (c.) connecting the remaining portion of said reference current to drive a second circuit branch which is operatively connected, through feedback circuitry, to provide current to the gate drive output in dependence on the remaining portion of said reference current, wherein said feedback circuitry imposes a divergence relation to reach one of only two stable steady-state conditions.

According to another disclosed class of innovative embodiments, there is provided: A method for controlling a plurality of bridge circuits which each include pull-up and pull-down power transistors operatively connected in series, comprising the steps of: I.) generating a pumped voltage, in a single charge-pumping circuit, which is more extreme than any power supply voltage; and II.) operating each of a plurality of gate drive circuits, all powered by said pumped voltage from said single charge-pumping circuit, with the steps of (a.) providing a reference current; (b.) diverting a portion of said reference current into at least a first circuit branch, said first circuit branch drawing an amount of current which is dependent on the voltage of the gate drive output; and (c.) connecting the remaining portion of said reference current to drive a second circuit branch which is operatively connected to provide current to the gate drive output in dependence on the remaining portion of said reference current; whereby if any one of said gate drive circuits is driving a high-side driver transistor whose source is shorted to ground, the charge-pumping circuit will not thereby be overloaded.

According to another disclosed class of innovative embodiments, there is provided: an integrated circuit for controlling a plurality of power transistors, comprising: a plurality of gate driving circuits, each connected to provide a gate voltage to at least one respective one of said respective power transistors; wherein at least one of said gate driving circuits comprises a differential error amplifier which is connected to receive, as differential inputs, a reference current, and a current corresponding to the current passed externally from a gate terminal to a first source/drain terminal of the switching device; a variable current source, connected to provide current to the gate of the power switching device, in dependence on the output of said error amplifier; a constant current source, connected to provide a constant current to the gate of the respective power transistor; and a voltage source interposed between gate and source of the respective power transistor; wherein said error amplifier is connected to increase said variable current when said reference current becomes greater than the other input to said error amplifier.

According to another disclosed class of innovative embodiments, there is provided: An integrated H-bridge driver circuit, comprising: a plurality of gate driving circuits, each connected to provide a gate voltage to at least one respective one of said respective power transistors; wherein at least one of said gate driving circuits comprises first and second bridge circuits, each including a pull-up transistor and a pull-down transistor with an output node therebetween, said output nodes of said first and second bridge circuits providing first and second respective load connections; a differential error amplifier which is connected to receive, as differential inputs, a reference current, and a current corresponding to the current passed externally from a gate terminal to a first source/drain terminal of the switching device; and a variable current source, connected to provide current to the gate of the power switching device, in dependence on the output of said error amplifier; wherein said error amplifier is connected to increase said variable current when said reference current becomes greater than the other input to said error amplifier.

According to another disclosed class of innovative embodiments, there is provided: An integrated bridge circuit, comprising a voltage augmenting circuit connected to receive a first supply voltage and generate an augmented voltage which not in the range of said first and second supply voltages, inclusive; high-side and low-side power field-effect transistors connected in series between said first and second supply voltages, and an output connection intermediate between said transistors; wherein said power transistors are both operatively connected to receive a gate voltage from respective gate driving circuits which are both driven by said augmented voltage; and wherein at least one said gate driving circuit includes a differential error amplifier which is connected to receive, as differential inputs, a reference current, and a current corresponding to the current passed externally from a gate terminal to a first source/drain terminal of the switching device; and a variable current source, connected to provide current to the gate of the power switching device, in dependence on the output of said error amplifier; wherein said error amplifier is connected to increase said variable current when said reference current becomes greater than the other input to said error amplifier.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, the preferred implementation (of FIGS. 2-5) can be modified in a tremendous variety of ways. For example, some circuit elements can be repositioned, or additional stages can be inserted. In some cases FET devices can be replaced by bipolars or vice versa. (Bipolars, however, do tend to provide greater headroom in current mirrors.)

For another example, the power transistors being controlled can optionally be discrete rather than integrated.

For another example, the power field-effect transistors being controlled can optionally be replaced by other analogous device structures, such as IGBTs, voltage-controlled thyristors, etc. In particular, the invention is particularly applicable to devices having a current-supplied capacitive gate.

For example, the disclosed circuit can be used with more or fewer bridge circuits; in particular, the advantages of the invention are increase when more bridge circuits or independent switching circuits are present on the chip. For example, the invention is expected to be even more applications for three-phase motor drivers, where three H-bridge switches are used to drive three windings.

The basic idea of the innovative current differencing amplifier can be done in many ways. For example, the configuration and connections of the differential error amplifier could be shifted in a wide variety of ways, and/or the offset contribution could be added using other circuit elements.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A method for driving a gate terminal of a high side driver power switching device, comprising the steps of
   (a.) operating a differential current-mode error amplifier which compares a reference current with a passing current passed from said gate terminal to a source terminal of said switching device;
   (b.) providing a variable current to said gate terminal of said switching device, through a current source which is controlled by the output of said error amplifier; and
   (c.) increasing said variable current when said passing current becomes less than said reference current.

2. The method of claim 1, wherein said variable current is drawn from a higher voltage supply than the potential of the source terminal or a drain terminal of the switching device.

3. The method of claim 1, wherein said error amplifier is connected to said current source to increase said variable current in a nonlinear dependence on said passing current.

4. The method of claim 1, wherein said reference current is diverted from said error amplifier when the switching device is turned off.

5. A method for driving a gate terminal of a high side driver power transistor, comprising the steps of:
   (a.) operating a differential current-mode error amplifier which compares a reference current with a passing current passed from said gate terminal to a source terminal of said power transistor;
   (b.) providing a variable current to said gate terminal of said power transistor, through a current source which is controlled by the output of said error amplifier;
   (c.) increasing said variable current when said passing current becomes less than said reference current;
   (d.) providing a constant offset current to said gate terminal of the power transistor;
   (e.) providing a voltage offset between said gate terminal and source terminal of the power transistor; and
   (f.) decreasing said variable current when said passing current becomes greater than said reference current.

6. The method of claim 5, wherein said variable current and said constant offset current are both drawn from a higher voltage supply than the potential of the source terminal or a drain terminal of the power transistor.

7. The method of claim 5, wherein said variable current is drawn from a higher voltage supply than the potential of the source terminal or a drain terminal of the power transistor.

8. The method of claim 5, wherein said error amplifier causes an increase to said variable current in a nonlinear dependence on said passing current.

9. The method of claim 5, wherein said reference current is diverted from said error amplifier when the power transistor is turned off.

10. A method for controlling a plurality of bridge circuits which each include pull-up and pull-down power transistors operatively connected in series, comprising the steps of:
    I.) generating, in a single charge-pumping circuit, a pumped voltage higher than any power supply voltage in a circuit that implements the method for controlling; and
    II.) operating each of a plurality of power transistors, all powered by said pumped voltage from said single charge-pumping circuit, with the steps of
    (a.) providing a reference current;
    (b.) diverting a portion of said reference current into a first circuit branch, said first circuit branch drawing an amount of current which is dependent on the voltage of an output to the power transistors;
    (c.) connecting the remaining portion of said reference current to drive a second circuit branch which is operatively connected to provide current to the output to the power transistors in dependence on the remaining portion of said reference current; and
    (d.) preventing the charge-pumping circuit from overload if any of the power transistors are shorted to ground.

11. The method of claim 10, wherein said step (c.) provides current to the output to the power transistors from a boosted supply voltage which is higher than the positive supply voltage of any source or drain of the power transistors.

12. The method of claim 10, wherein said step (a.) provides a constant bandgap-referenced reference current.

13. An integrated circuit for controlling a plurality of power switching devices, comprising:
    a plurality of gate driving circuits, each connected to provide a gate voltage to at least one respective one of said power switching devices;
    wherein at least one of said gate driving circuits comprises
       a differential error amplifier which is connected to receive, as different inputs, a reference current, and a second current flowing from a gate terminal to a source terminal of said respective one of the power switching devices;
       a variable current source, connected to provide a variable current to the gate of said respective one of the power switching devices, in dependence on the output of said error amplifier;
       a constant current source, connected to provide a constant current to the gate of said respective one of said power switching devices; and
       a voltage source interposed between the gate and source of said respective one of said power switching devices;
    wherein said error amplifier is connected to said variable current source to increase said variable current when said second current becomes smaller than said reference current.

14. The circuit of claim 13, wherein said variable current source is connected to a higher voltage supply than the potential of the terminals of the power switching devices.

15. The circuit of claim 13, wherein said error amplifier is connected to said variable current source to increase said variable current in a nonlinear dependence on said second current.

16. The circuit of claim 13, wherein said reference current is diverted from said error amplifier when the power switching device is turned off.

17. The circuit of claim 13, wherein said reference current is a constant bandgap-referenced reference current.

18. An integrated H-bridge driver circuit, comprising:
    a plurality of gate driving circuits, each connected to provide a gate voltage to at least one respective one of a plurality of power transistors;
    wherein at least one of said gate driving circuits comprises first and second bridge circuits, each including a pull-up power transistor and a pull-down power transistor with an output node therebetween, said output nodes of said first and second bridge circuits providing first and second respective load connections;

a differential error amplifier connected to receive, as differential inputs, a reference current, and a second current flowing from a gate terminal to a source terminal of said respective one of the power transistors, said error amplifier connected to a variable current source to increase a variable current provided to the gate of the pull-up power transistor in dependence on the output of said error amplifier when said second current becomes smaller than said reference current.

19. The circuit of claim 18, wherein said variable current source is connected to a higher voltage supply than the potential of the source terminal or drain terminal of any power transistor said H-bridge driver circuit.

20. The circuit of claim 18, wherein said error amplifier is connected to said variable current source to increase said variable current in a nonlinear dependence on said second current.

21. The circuit of claim 18, wherein said reference current is diverted from said error amplifier when the respective power transistor is turned off.

22. The circuit of claim 18, wherein said reference current is a constant bandgap-referenced reference current.

23. An integrated bridge circuit, comprising:

a voltage augmenting circuit connected to receive a first supply voltage and generate an augmented voltage which has a voltage value outside of the values between said first supply voltage and a second supply voltage, inclusive;

a high-side power transistor and a low-side power transistor connected in series between said first and second supply voltages, and an output connection intermediate between said transistors;

said high-side power transistor operatively connected to receive a gate voltage from a gate driving circuit which is driven by said augmented voltage;

wherein said gate driving circuit includes a variable current source connected to provide a variable current to the gate terminal of one of the power transistors; and a differential error amplifier which is connected to receive, as differential inputs, a reference current, and a second current, corresponding to the current flowing from a gate terminal to a source terminal of the one of the power transistors, said error amplifier connected to increase said variable current when said second current becomes smaller than said reference current.

24. The circuit of claim 23, wherein said variable current source is connected to a higher voltage supply than the potential of any source terminal or drain terminal of the power transistors.

25. The circuit of claim 23, wherein said error amplifier is connected to said variable current source to increase said variable current in a nonlinear dependence on said second current.

26. The circuit of claim 23, wherein said reference current is diverted from said error amplifier when the high-side power transistor is turned off.

27. The circuit of claim 23, wherein said reference current is a constant bandgap-referenced reference current.

* * * * *

UNITED STATES PATENT AND TRADEMARK OFFICE
CERTIFICATE OF CORRECTION

PATENT NO. : 5,796,276
DATED : August 18, 1998
INVENTOR(S) : William Phillips and Mario Paparo It is certified that error appears in the above-identified patent and that said Letters Patent is hereby corrected as shown below:

In column 2, line 7, please delete all but the first word, "driver".

In column 2, line 18 please delete from the beginning of the line up to, but not including, the period.

In column 2, line 8, please delete "very high level schematic".

In column 2, line 20, please delete "simplified" and insert therefor -- detailed -- .

In column 3, line 24, please delete "Q11/Q102" and insert -- Q101/Q102 -- .

In column 3, please delete lines 41 through 67 inclusive and insert
-- During charging of the power device, the current differencing amplifier is hard-on. All of the current from M104 flows into M9 and is mirrored up through M8, M107 and M108 to supply the maximum current to the gate of the output device. In this state Q102 is totally off because there is inadequate voltage to cause zeners D1 and D2 to conduct.
 Because M108 is much larger than M107, a large current is provided in this state which rapidly charges the gate of the power device up to Vcp. After the gate is charged, Q102 begins to conduct, tending to shut off M108. As the gate voltage nears Vcp, the $V_{DS}$ of both M108 and M109 collapse, reducing their currents, until a stable state is reached with about $5\mu A$ in Q102, Q101, and Q2. -- .

In column 4, please delete lines 1 through 3.

UNITED STATES PATENT AND TRADEMARK OFFICE
CERTIFICATE OF CORRECTION

PATENT NO. : 5,796,276
DATED : August 18, 1998
INVENTOR(S) : William Phillips and Mario Paparo It is certified that error appears in the above-identified patent and that said Letters Patent is hereby corrected as shown below:

In column 4, line 4, please delete all but the last word, "If".

Signed and Sealed this

Tenth Day of August, 1999

Attest:

Q. TODD DICKINSON

*Attesting Officer*  *Acting Commissioner of Patents and Trademarks*